United States Patent
Lee et al.

(10) Patent No.: US 8,398,208 B2
(45) Date of Patent: Mar. 19, 2013

(54) CERAMIC PRINTED CIRCUIT BOARD (PCB) AND INKJET PRINTHEAD ASSEMBLY USING THE SAME

(75) Inventors: Jun-ho Lee, Suwon-si (KR); Seong-nam Jeon, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 647 days.

(21) Appl. No.: 12/354,838

(22) Filed: Jan. 16, 2009

(65) Prior Publication Data

US 2010/0007701 A1 Jan. 14, 2010

(30) Foreign Application Priority Data

Jul. 8, 2008 (KR) ........................ 10-2008-0066011

(51) Int. Cl.
*B41J 2/14* (2006.01)

(52) U.S. Cl. ................. 347/50; 347/49; 347/63; 347/57

(58) Field of Classification Search ..................... 347/50, 347/49, 63, 57–59; 326/30; 333/22 R
See application file for complete search history.

(56) References Cited

U.S. PATENT DOCUMENTS

| | | | |
|---|---|---|---|
| 6,520,624 B1 * | 2/2003 | Horvath et al. | 347/42 |
| 6,578,940 B2 * | 6/2003 | Rehmann et al. | 347/5 |
| 2004/0262645 A1 * | 12/2004 | Huff et al. | 257/232 |
| 2008/0094446 A1 * | 4/2008 | Sheahan et al. | 347/40 |

* cited by examiner

*Primary Examiner* — Matthew Luu
*Assistant Examiner* — Henok Legesse
(74) *Attorney, Agent, or Firm* — Stanzione & Kim, LLP

(57) ABSTRACT

A ceramic printed circuit board (PCB) and an inkjet printhead assembly using the ceramic PCB. A ceramic PCB in which a plurality of layers are stacked includes a plurality of terminals to receive an electric signal from an external source, a plurality of circuit patterns connected to the plurality of terminals to transmit the electric signal, and a termination resistor having a predetermined thickness disposed between the plurality of circuit patterns, wherein the termination resistor is mounted between the plurality of stacked layers.

7 Claims, 9 Drawing Sheets

CERAMIC PRINTED CIRCUIT BOARD (PCB) AND INKJET PRINTHEAD ASSEMBLY USING THE SAME

CROSS-REFERENCE TO RELATED APPLICATIONS

This application claims priority under 35 U.S.C. §119(a) from Korean Patent Application No. 10-2008-0066011, filed on Jul. 8, 2008, in the Korean Intellectual Property Office, the disclosure of which is incorporated herein by reference in its entirety.

BACKGROUND OF THE INVENTION

1. Field of the Invention

The present general inventive concept relates to a ceramic printed circuit board (PCB) and an inkjet printhead assembly. More particularly, the present general inventive concept relates to a ceramic PCB which includes a termination resistor to increase signal quality, and an inkjet printhead assembly using the ceramic PCB.

2. Description of the Related Art

Inkjet printers transmit low voltage differential signaling (LVDS) generated by drivers of main boards to head chips, namely final reception terminals, so that ink is ejected from the head chips. In order to increase signal quality, it is desirable that termination resistors for impedance matching between drivers of main boards and head chips be mounted as close as possible to areas in which head chips are mounted.

Conventionally, termination resistors have been mounted in ceramic boards through additional processes. However, if a termination resistor is mounted in a ceramic board, the termination resistor may be electrically connected to a head chip via a pad, so signal shorts may occur due to leakage of ink. Accordingly, the termination resistor needs to be separated from an ink supply path, so as to be located at a predetermined distance from the head chip, namely a final reception terminal.

However, to remove these problems, if the termination resistor is mounted in a main board, the distance between the termination resistor and the head chip may increase, so the LVDS may be distorted as illustrated in FIG. 1. FIGS. 1 and 2 illustrate graphs of signal quality measured when a conventional termination resistor is mounted in a main board. The graph of FIG. 1 illustrates the signal quality measured when the distance between the conventional termination resistor and the head chip is a certain distance referred to as S1. If the length of a cable used to connect the main board to the ceramic board is reduced in order to minimize distance S1, high frequency components may be added to the LVDS, thereby reducing the signal quality as illustrated in FIG. 2. In this situation, the distance between the conventional termination resistor and the head chip is referred to as S2 (here, S1>S2).

SUMMARY OF THE INVENTION

The present general inventive concept provides a ceramic printed circuit board (PCB) which includes a termination resistor capable of being located at a minimum distance from a final reception terminal, in order to prevent the signal quality from being reduced, and an inkjet printhead assembly using the ceramic PCB.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a ceramic printed circuit board (PCB) in which a plurality of layers are stacked, the ceramic PCB including a plurality of terminals to receive an electric signal from an external source, a plurality of circuit patterns connected to the plurality of terminals to transmit the electric signal, and at least one termination resistor having a predetermined thickness disposed between the plurality of circuit patterns. The at least one termination resistor may be mounted between the plurality of stacked layers.

The ceramic PCB may further include a final reception terminal disposed on the top layer among the plurality of stacked layers to finally receive the electric signal, and the at least one termination resistor may be disposed directly beneath the top layer.

The plurality of terminals, the plurality of circuit patterns, and the at least one termination resistor may be disposed on the same layer among the plurality of layers.

The at least one termination resistor may have a zigzag form.

If the plurality of circuit patterns are formed on different layers, the at least one termination resistor may be disposed between the plurality of circuit patterns formed on different layers.

The final reception terminal may be an array type head chip or a shuttle type head chip. The electric signal may be low voltage differential signaling (LVDS). The electric signal may require the at least one termination resistor.

The plurality of layers may be stacked through a high temperature co-fired ceramic (HTCC) process.

The foregoing and/or other features and utilities of the present general inventive concept may be achieved by providing an inkjet printhead assembly including a ceramic board in which at least one termination resistor is mounted, at least one final reception terminal disposed on the ceramic board to finally receive an electric signal from an external source, and a substructure to support the ceramic board.

The ceramic board may include a plurality of ceramic layers which are stacked, a plurality of terminals to receive an electric signal from the external source, and a plurality of circuit patterns connected to the plurality of terminals to transmit the electric signal to the at least one final reception terminal. The at least one termination resistor may have a predetermined thickness and may be disposed between the plurality of circuit patterns.

The at least one final reception terminal may be disposed on the top layer among the plurality of stacked ceramic layers, and the at least one termination resistor may be disposed directly beneath the top layer.

The at least one final reception terminal may be at least one head chip to eject ink via a plurality of nozzles.

The foregoing and/or other features and utilities of the present general inventive concept may be achieved by providing a printed circuit board including a final reception terminal, a circuit pattern unit to transmit a received signal to the final reception terminal, and a termination resistor electrically connected to the circuit pattern unit and formed to reduce a distortion of the received signal.

The length of an electrical path across the termination resistor may be a multiple of a length of the resistor.

The termination resistor may have an electrical path length which is longer than a length of the termination resistor.

The termination resistor may be disposed at a predetermined distance from the final reception terminal.

The foregoing and/or other features and utilities of the present general inventive concept may be achieved by providing a printed circuit board, including a termination resistor disposed between a plurality of circuit patterns to reduce a distortion of a signal received and communicated by the plurality of circuit patterns, and a final reception terminal to finally receive the signal communicated by the plurality of circuit patterns.

The termination resistor may have an electrical path length longer than a length of the termination resistor.

The termination resistor may form a connection length to the plurality of circuit patterns which is a multiple of a length of the termination resistor.

The plurality of circuit patterns may be arranged vertically relative to the printed circuit board.

The plurality of circuit patterns may be arranged horizontally relative to the printed circuit board.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
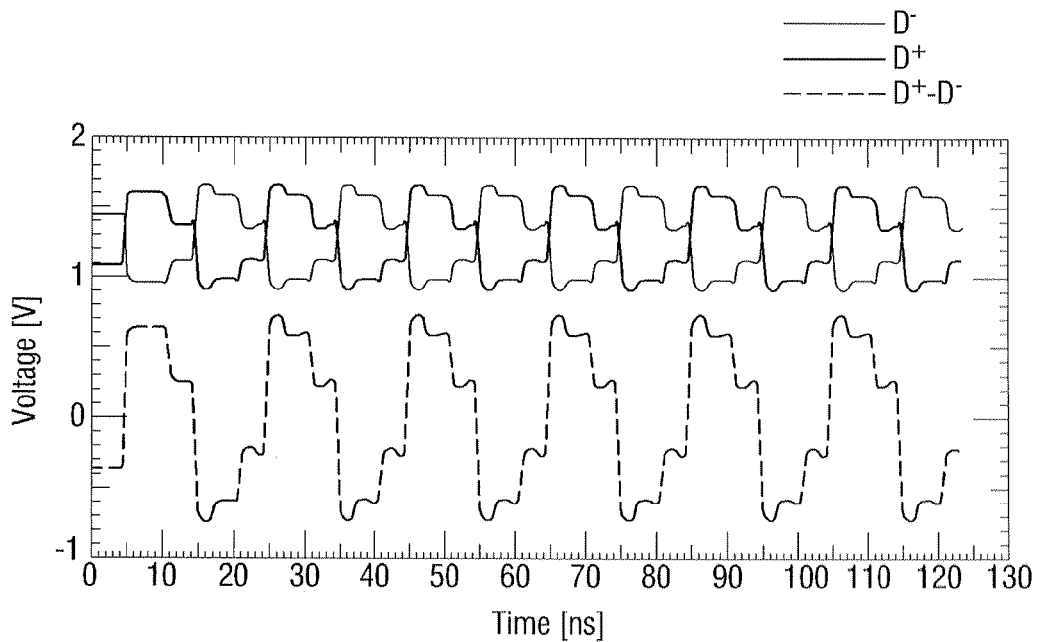
FIGS. 1 and 2 illustrate graphs of signal quality measured when a conventional termination resistor is mounted in a main board.
Figure 2:
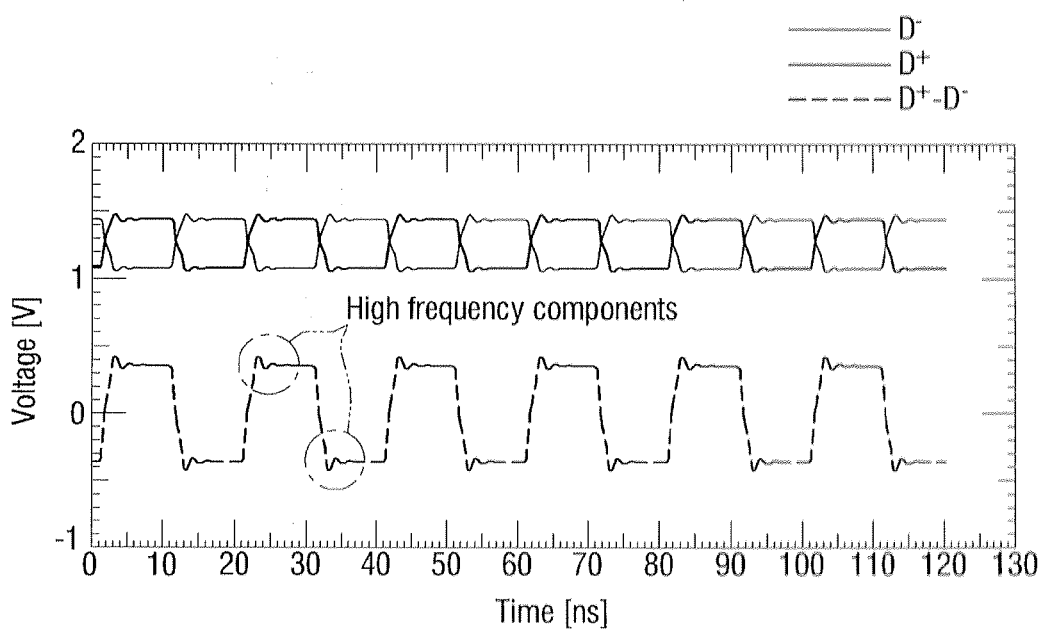

Reference will now be made in detail to exemplary embodiments of the present general inventive concept, with reference to the accompanying drawings, wherein like reference numerals refer to the like elements throughout. The embodiments are described below in order to explain the present general inventive concept by referring to the figures.

Figure 3:
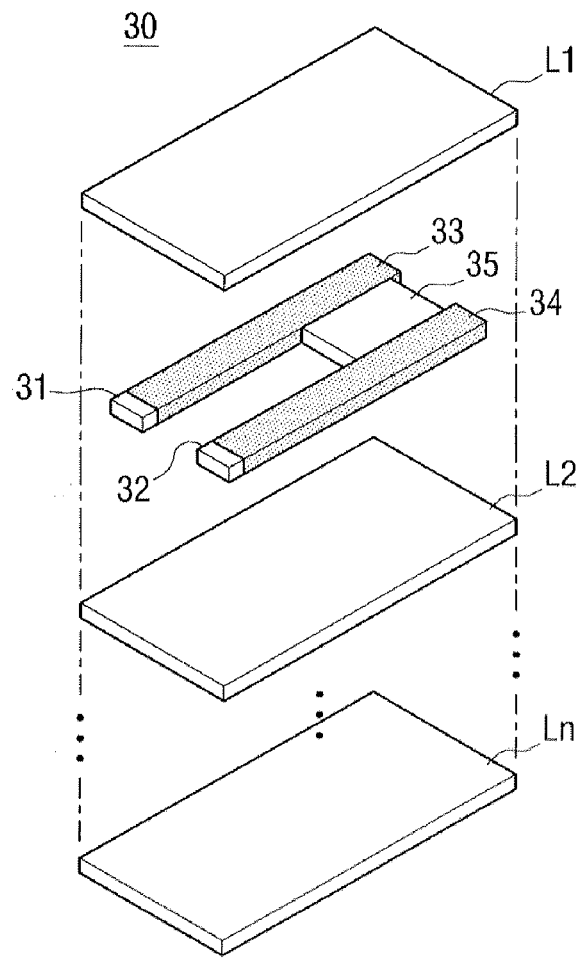
FIG. 3 illustrates a ceramic printed circuit board (PCB) according to an exemplary embodiment of the present general inventive concept.
Figure 4:
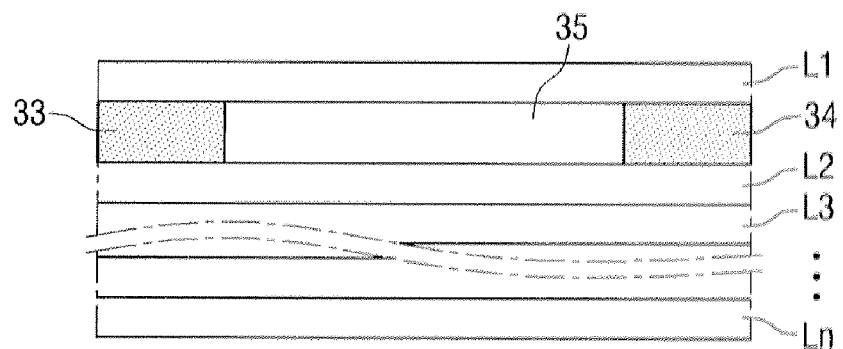
FIG. 4 illustrates a partial side view of the ceramic PCB illustrated in FIG. 3.

FIG. 3 illustrates a ceramic printed circuit board (PCB) 30 according to an exemplary embodiment of the present general inventive concept, and FIG. 4 illustrates a partial side view of the ceramic PCB 30.

Referring to FIGS. 3 and 4, the ceramic PCB 30 includes a plurality of layers L1, L2, . . . , Ln (here, n is a positive integer), a plurality of terminals 31, 32, a plurality of circuit patterns 33, 34, and a termination resistor 35.

The plurality of layers L1, L2, . . . , Ln are stacked to form the ceramic PCB 30. The plurality of layers L1, L2, . . . , Ln includes insulating layers made of, for example, ceramic. The use of ceramic makes it possible to prevent distortion of a board, that is, to prevent a board from being twisted due to an increase in the strength and thermal resistance of the board. The plurality of layers L1, L2, . . . , Ln may be fabricated through a high temperature co-fired ceramic (HTCC) process suitable to manufacture ceramic sheets, but this is merely an example and there is no limitation thereto.

The plurality of terminals 31, 32 receive an electric signal from an external source. The plurality of terminals 31, 32 may desirably be disposed above each of the plurality of layers L1, L2, . . . , Ln, and the external source may be a driver on another board. Additionally, if the received electric signal contains two signal components in a similar manner to low voltage differential signaling (LVDS), at least one pair of terminals 31, 32 may desirably be included in each of the plurality of layers L1, L2, . . . , Ln, to receive both of the signal components. While FIG. 3 illustrates only two terminals 31, 32 for convenience of description, the number of plurality of terminals 31, 32 may be two or greater. Additionally, if the received electric signal is LVDS, the termination resistor 35 is required.

Each of the plurality of circuit patterns 33, 34 is electrically connected to each of the plurality of terminals 31, 32, and transmits an electric signal to a final reception terminal. The final reception terminal functions as an element to finally receive an electric signal.

Figure 5A:
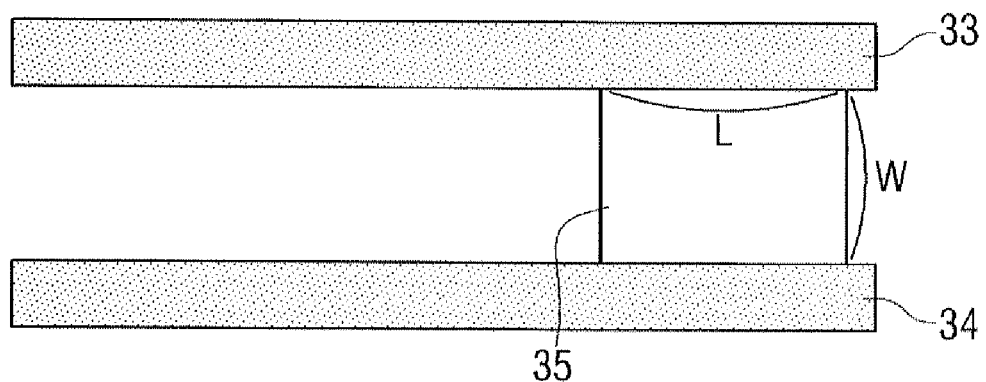
FIGS. 5A and 5B illustrate a plane view and a side view, respectively, of a termination resistor illustrated in FIG. 3, respectively.
Figure 5B:
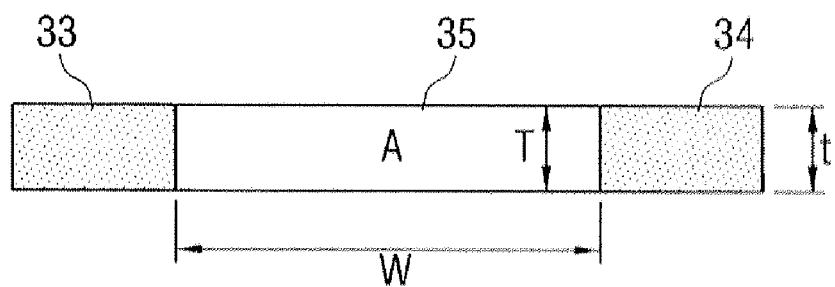

FIGS. 5A and 5B illustrate a plane view and a side view, respectively, of the termination resistor 35 illustrated in FIG. 3.

As illustrated in FIGS. 5A and 5B, the termination resistor 35 having a predetermined thickness T is disposed between the plurality of circuit patterns 33, 34. The termination resistor 35 refers to a built-in resistor between the plurality of layers L1, L2, . . . , Ln, and may be disposed above a layer on which the plurality of terminals 31, 32 and plurality of circuit patterns 33, 34 are disposed.

The termination resistor 35 includes, for example, an element including resistant components to perform impedance matching between the final reception terminal and the external source to provide electric signals. One or more termination resistors 35 may be disposed on a single layer, or may be disposed between each of the plurality of layers L1, L2, . . . , Ln. The resistance of the termination resistor 35 is computed using the following Equation 1.

$$R = \rho \frac{L}{A} \quad (A = WT) \qquad \text{[Equation 1]}$$

In Equation 1, R indicates the resistance of the termination resistor 35, ρ indicates the resistivity of an element used in the termination resistor 35, L indicates the length of the termination resistor 35, A indicates the area of the side of the termination resistor 35, W indicates the width of the termination resistor 35, and T indicates the thickness of the termination resistor 35. If a designer desires the resistance of the termination resistor 35 to be a certain value, the resistivity, length, width or thickness of the termination resistor 35 may be adjusted to acquire the desired resistance.

Figure 6A:
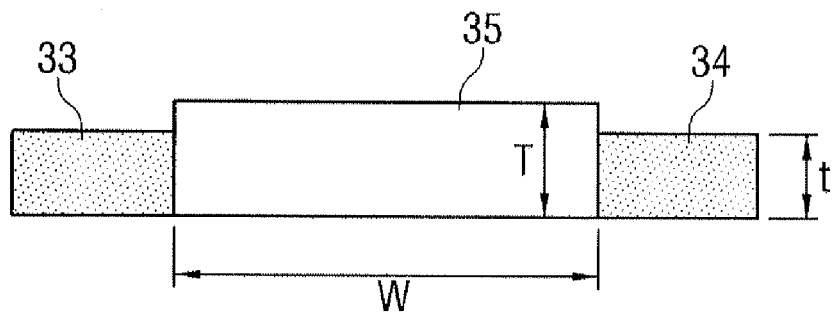
FIGS. 6A and 6B exemplarily illustrate a change of thickness of the termination resistor illustrated in FIG. 3.
Figure 6B:
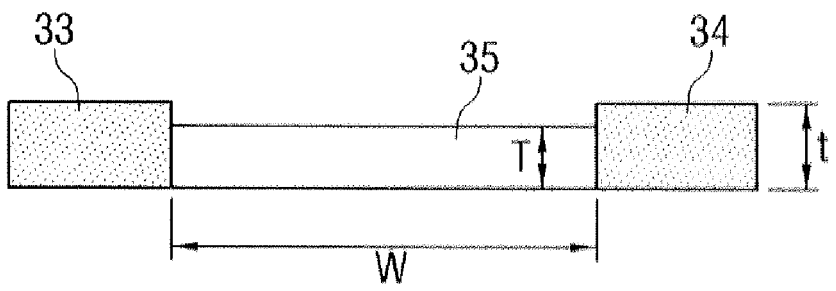

The thickness T of the termination resistor 35 may be set to be equal to thickness t of the circuit patterns 33, 34 as illustrated in FIG. 5B, or to be greater or less than thickness t of the circuit patterns 33, 34 as illustrated in FIGS. 6A and 6B.

Figure 7A:
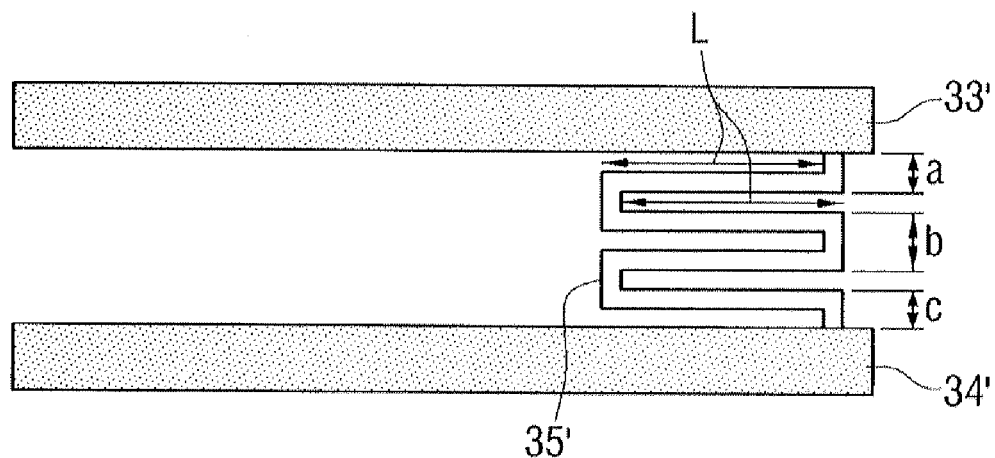
FIG. 7A exemplarily illustrates a termination resistor in a different form from the termination resistor illustrated in FIG. 3.
Figure 7B:
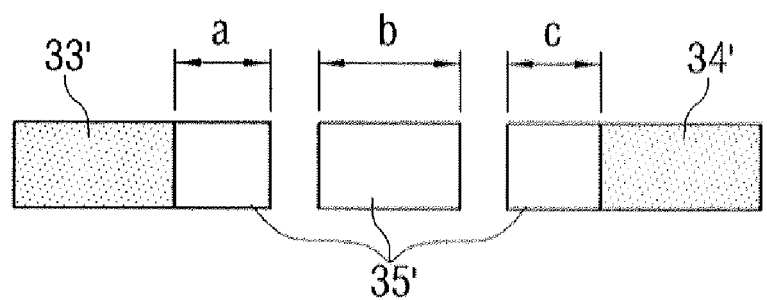
FIG. 7B illustrates a partial side view of the termination resistor illustrated in FIG. 7A.

FIG. 7A exemplarily illustrates another termination resistor in a different form from the termination resistor 35 illustrated in FIG. 3, and FIG. 7B exemplarily illustrates a partial side view of the termination resistor illustrated in FIG. 7A.

As illustrated in FIGS. 7A and 7B, the termination resistor 35' is disposed in a zigzag form between the plurality of circuit patterns 33', 34'. The length L of the termination resistor 35 of FIG. 7A becomes longer than that of the termination resistor 35 of FIG. 3, so it is easy to increase the size of the termination resistor 35' of FIG. 7A. The width of the termination resistor 35' of FIG. 7A may be obtained by summing values of a, b and c.

As described above, the ceramic PCB 30 is configured by stacking the plurality of layers L1, L2, . . . , Ln. The termination resistor 35 may desirably be disposed directly beneath a layer in which the final reception terminal is disposed. For example, it is desirable that the final reception terminal be disposed on the top layer L1 among the plurality of layers L1, L2, . . . , Ln, and that the termination resistor 35 be disposed on the layer L2 below the top layer L1. Accordingly, the distance between the final reception terminal and termination resistor 35 may be reduced, so it is possible to prevent signal distortion and to ensure signal quality.

Figure 8A:
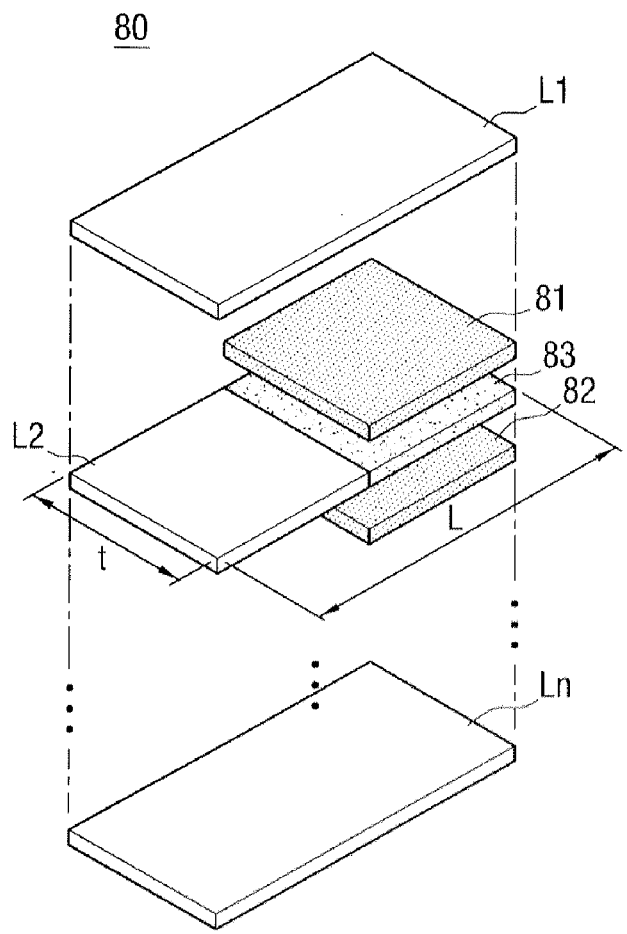
FIG. 8A illustrates a ceramic PCB according to another exemplary embodiment of the present general inventive concept.
Figure 8B:
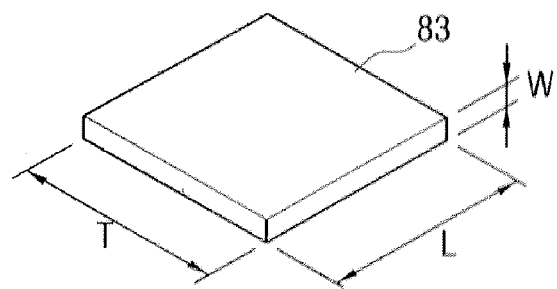
FIG. 8B illustrates a perspective view of a resistor of the ceramic PCB illustrated in FIG. 8A.

FIG. 8A illustrates a ceramic PCB 80 according to another exemplary embodiment of the, present general inventive concept, and FIG. 8B illustrates a termination resistor 83 of the ceramic PCB 80 illustrated in FIG. 8A.

In FIG. 8A, the ceramic PCB 80 includes a plurality of layers L1, L2, . . . , Ln (here, n is a positive integer), a plurality of circuit patterns 81, 82, and a termination resistor 83. The plurality of layers L1, L2, . . . , Ln, the plurality of circuit patterns 81, 82, and the termination resistor 83 illustrated in FIG. 8A are similar to the plurality of layers L1, L2, . . . , Ln, the plurality of circuit patterns 33, 34, and the termination resistor 35 illustrated in FIG. 3A, respectively, so further detailed description is omitted herein. Additionally, each of the plurality of layers L1, L2, . . . , Ln includes a pad (not illustrated) for electrical connection.

The plurality of circuit patterns 81, 82 of FIG. 8A are arranged vertically, which differs from the arrangement of the plurality of circuit patterns 33, 34 of FIG. 3A. In more detail, one circuit pattern 81 is disposed below the first layer L1 and the other circuit pattern 82 is disposed above the second layer L2, and the termination resistor 83 is disposed between the plurality of circuit patterns 81, 82, as illustrated in FIG. 8A.

The termination resistor 83 has a predetermined length L, width W and thickness T, as illustrated in FIG. 8B. The termination resistor 83 may also be configured in the same form as the termination resistor 35 illustrated in FIG. 7A, that is, in a zigzag form.

Figure 9:
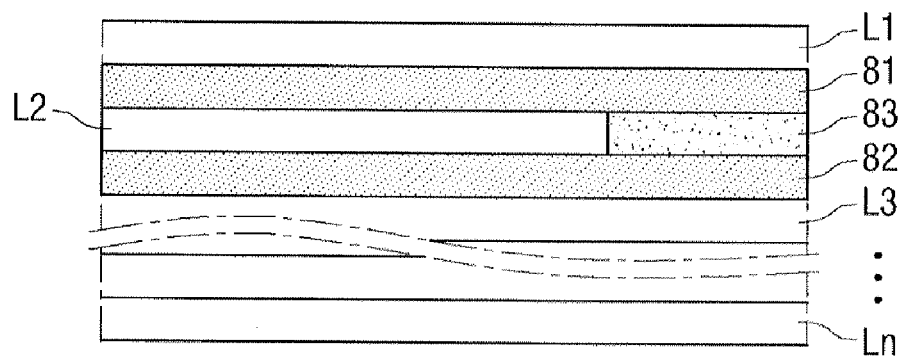
FIG. 9 illustrates a partial side view of a ceramic PCB illustrated in FIG. 8A.

FIG. 9 illustrates a partial side view of the ceramic PCB 80 illustrated in FIG. 8A. As illustrated in FIG. 9, the termination resistor 83 is disposed between the circuit patterns 81, 82, and the thickness T of the termination resistor 83 may be different from or identical to the thickness t of the circuit patterns 81, 82 according to the design.

Figure 10:
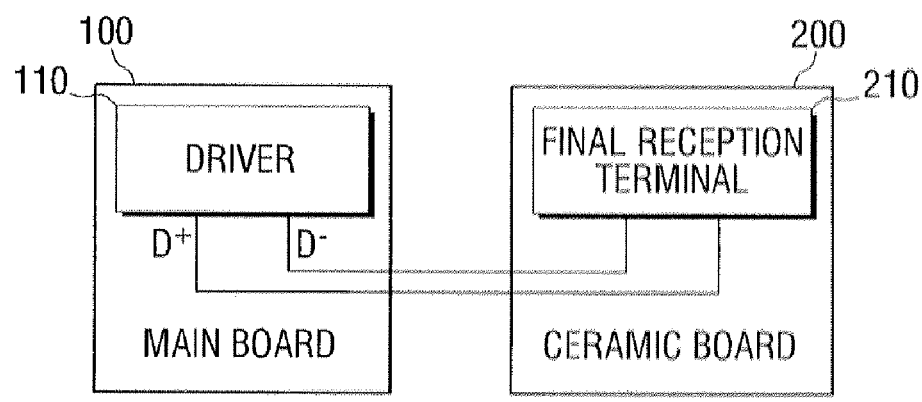
FIG. 10 schematically illustrates a circuit system to which an inkjet printhead assembly is applied according to an exemplary embodiment of the present general inventive concept.

FIG. 10 schematically illustrates a circuit system to which an inkjet printhead assembly is applied according to an exemplary embodiment of the present general inventive concept.

The circuit system illustrated in FIG. 10 includes a main board 100 and a ceramic board 200. The main board 100 includes a driver 110 to form an electric signal and to send the electric signal to the ceramic board 200. If LVDS is driven by the driver 110, the driver 110 may send two signals D+ and D−. The ceramic board 200 includes a final reception terminal 210 to eject ink through a nozzle according to the electric signal received from the driver 110.

Figure 11:
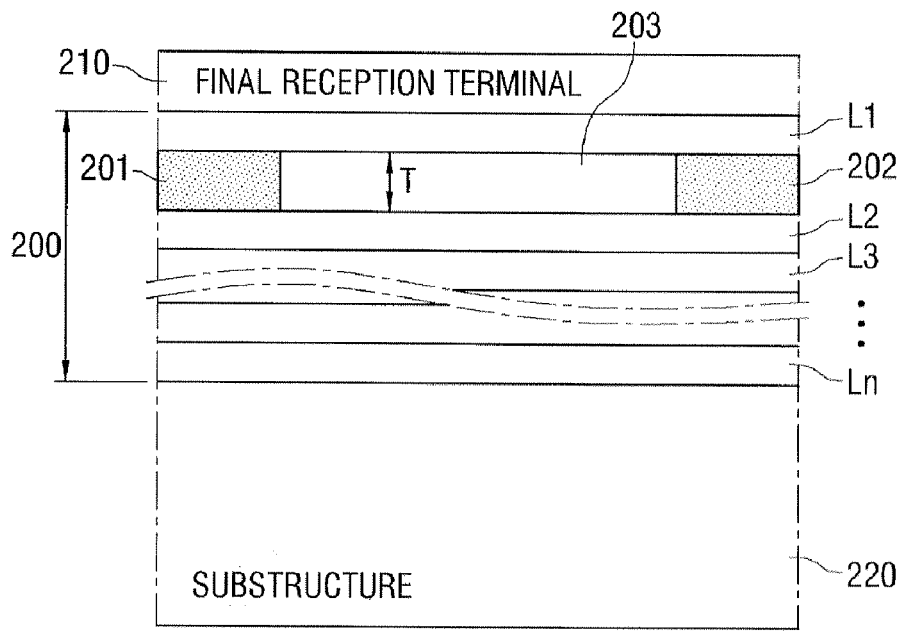
FIG. 11 illustrates a sectional view of the inkjet printhead assembly of FIG. 10 according to an exemplary embodiment of the present general inventive concept.

FIG. 11 illustrates a sectional view of the inkjet printhead assembly of FIG. 10 according to an exemplary embodiment of the present general inventive concept.

In FIG. 11, the inkjet printhead assembly includes the ceramic board 200, at least one final reception terminal 210 and a substructure 220. For example, the inkjet printhead assembly may be a carrier.

The ceramic board 200 of FIG. 11 refers to a PCB in which at least one termination resistor 203 is mounted. The ceramic board 200 includes a plurality of pads (not illustrated) for electrical connection with the at least one final reception terminal 210. The ceramic board 200 of FIG. 11 may be the ceramic PCB 30 or ceramic PCB 80 described above with reference to FIGS. 3 to 9, so further detailed description of the ceramic board 200 is omitted. A termination resistor 203 has a predetermined thickness T, and is disposed between a plurality of circuit patterns 201, 202.

The at least one final reception terminal 210 is disposed above the ceramic board 200, and may be, for example, a head chip to eject ink via a plurality of nozzles. The pad (not illustrated) of the final reception terminal 210 may desirably be connected to a pad (not illustrated) on the ceramic board 200 by wire bonding. Additionally, the final reception terminal 210 may finally receive the electric signal from the driver 110.

The substructure 220 provides an ink supply path, and serves to support the ceramic board 200.

The above-described inkjet printhead assembly is applicable to a shuttle type inkjet printer or an array type inkjet printer. If the final reception terminal 210 is a head chip, the shuttle type inkjet printer may perform printing while causing the head chip to move back and forth, and the array type inkjet printer may perform printing after fixing a plurality of head chips.

Figure 12:
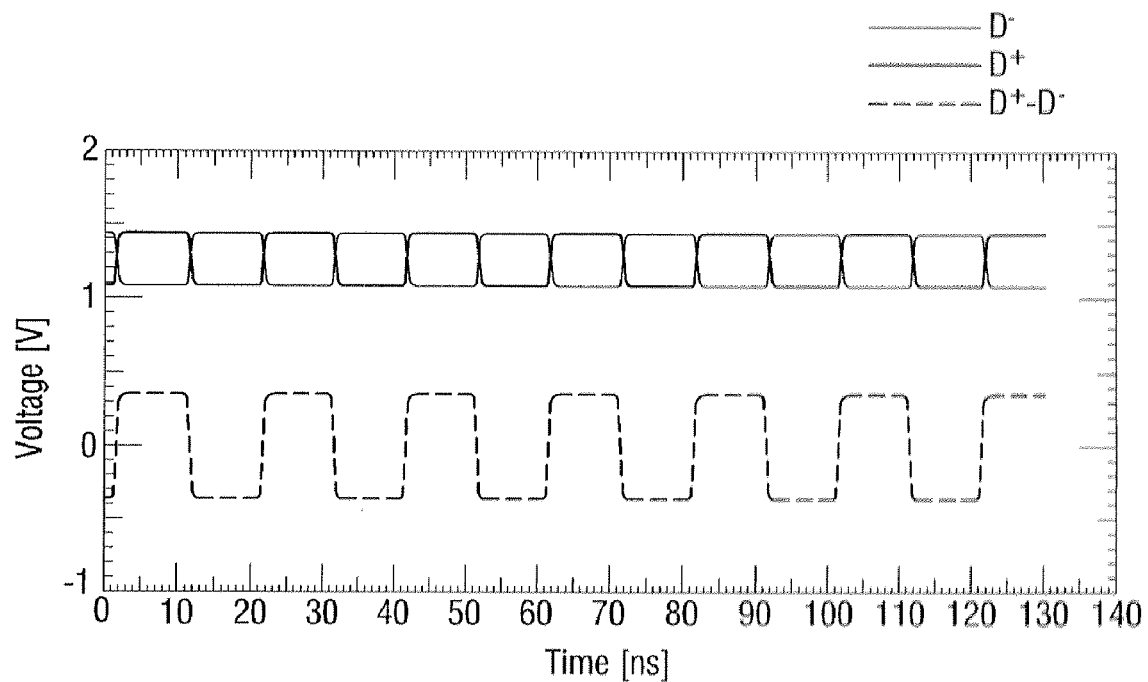
FIG. 12 illustrates a graph of signal quality measured when a termination resistor is mounted in a ceramic board as illustrated in FIG. 11.

FIG. 12 illustrates a graph of signal quality measured when the termination resistor 203 is mounted in the ceramic board 200 as illustrated in FIG. 11. The graph of FIG. 12 illustrates the signal quality when the minimum distance between the termination resistor 203 and the final reception terminal 210 is distance S3 (here, S3>S1>S2). As illustrated in FIG. 12, electric signals D+ and D− may be received without distortion even at the minimum distance.

Figure 13:
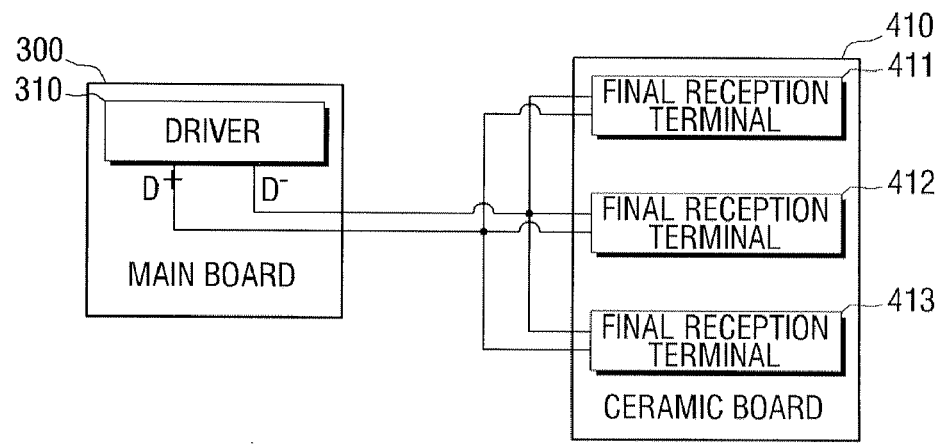
FIG. 13 schematically illustrates a circuit system to which an inkjet printhead assembly is applied according to another exemplary embodiment of the present general inventive concept.

FIG. 13 schematically illustrates a circuit system to which an inkjet printhead assembly may be applied according to another exemplary embodiment of the present general inventive concept.

The circuit system illustrated in FIG. 13 includes a main board 300 and a ceramic board 410. The main board 300 includes a driver 310, and the ceramic board 410 includes a plurality of final reception terminals 411, 412, 413. Since the circuit system illustrated in FIG. 13 is configured in a similar manner to the circuit system described above with reference to FIGS. 10 and 11, no further detailed description of the circuit system illustrated in FIG. 13 is required. However, in the circuit system illustrated in FIG. 13, three final reception terminals 411, 412, 413 are disposed on the ceramic board 410 instead of a single final reception terminal. Additionally, a termination resistor (not illustrated) may be mounted in the ceramic board 410, so it is possible to maintain the minimum distance between the termination resistor and the final reception terminals 411, 412, 413 in order to ensure signal quality.

Figure 14:
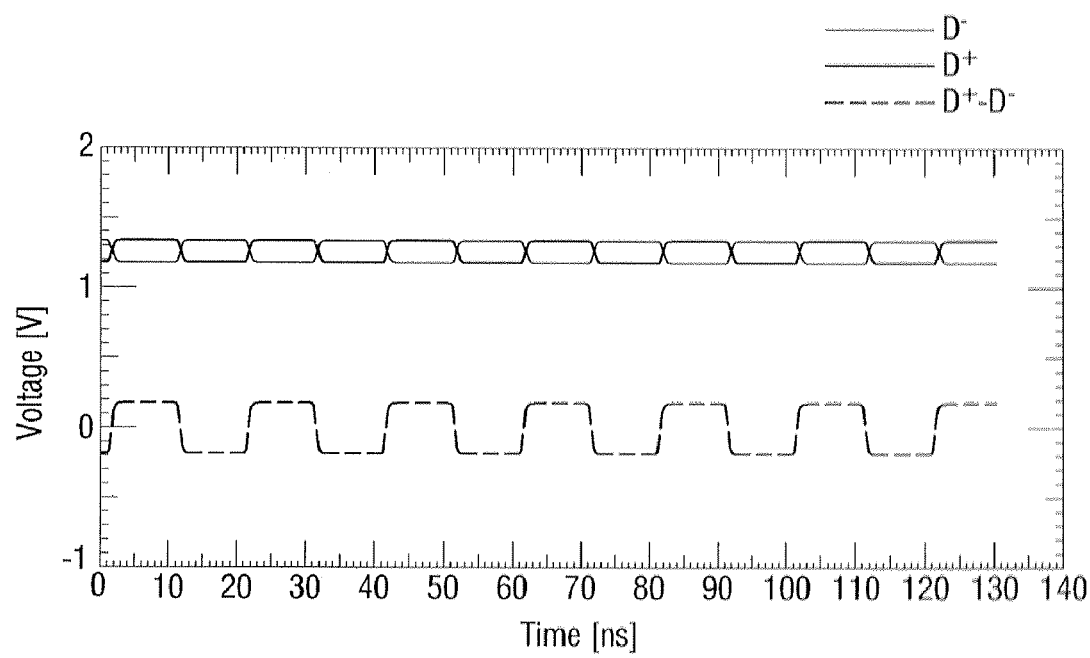
FIG. 14 illustrates a graph of signal quality measured at final reception terminals of the circuit system illustrated in FIG. 13.

FIG. 14 illustrates a graph of signal quality measured at each of the final reception terminals 411, 412, 413 of the circuit system illustrated in FIG. 13. Since the termination resistor (not illustrated) may be mounted in the ceramic board 410, the signal quality may be ensured without distortion, as illustrated in FIG. 14.

As described above, the present general inventive concept provides that the ceramic PCB and inkjet printhead assembly, to provide a built-in termination resistor, so that it is possible to perform impedance matching more easily and increase the signal quality. Additionally, according to the exemplary embodiments of the present general inventive concept, the built-in termination resistor may be disposed at a final reception terminal for finally receiving LVDS, so if LVDS is received, the signal quality may be improved without the use of additional devices.

Although a few embodiments of the present general inventive concept have been illustrated and described, it will be appreciated by those skilled in the art that changes may be made to these embodiments without departing from the principles and spirit of the general inventive concept, the scope of which is defined in the appended claims and their equivalents.

What is claimed is:

1. An inkjet printhead assembly comprising:
   a ceramic board in which at least one termination resistor is mounted, the ceramic board including a plurality of ceramic layers which are stacked in a first direction;
   at least one head chip disposed on the ceramic board to eject ink via at least one nozzle by using an electric signal received from an external source;
   a substructure to support the ceramic board; and
   a plurality of circuit patterns stacked in physical contact with the termination resistor above and below the termination resistor in the first direction.

2. The inkjet printhead assembly as claimed in claim 1, wherein the ceramic board comprises:
   a plurality of terminals to receive an electric signal from the external source, the plurality plurality of circuit patterns connected to the plurality of terminals to transmit the electric signal to the at least one head chip,
   wherein the at least one termination resistor has a predetermined thickness and is disposed between the plurality of circuit patterns.

3. The inkjet printhead assembly as claimed in claim 1, wherein the at least one head chip is an array type head chip or a shuttle type head chip.

4. The inkjet printhead assembly as claimed in claim 1, wherein the electric signal comprises low voltage differential signaling (LVDS).

5. The inkjet printhead assembly as claimed in claim 2, wherein the at least one head chip is disposed on the top layer among the plurality of stacked ceramic layers, and the at least one termination resistor is disposed directly beneath the top layer.

6. The inkjet printhead assembly as claimed in claim 2, wherein the plurality of ceramic layers are stacked through a high temperature co-fired ceramic (HTCC) process.

7. The inkjet printhead assembly as claimed in claim 4, wherein the electric signal requires the at least one termination resistor.

* * * * *